US009473163B1

(12) United States Patent
Tsai

(10) Patent No.: US 9,473,163 B1
(45) Date of Patent: Oct. 18, 2016

(54) PREAMPLIFIER CIRCUIT AND SAR ADC USING THE SAME

(71) Applicant: MEDIATEK Inc., Hsin-Chu (TW)

(72) Inventor: Jen-Huan Tsai, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/060,661

(22) Filed: Mar. 4, 2016

Related U.S. Application Data

(60) Provisional application No. 62/198,330, filed on Jul. 29, 2015.

(51) Int. Cl.
| H03M 1/50 | (2006.01) |
| H03M 1/46 | (2006.01) |
| H03F 1/02 | (2006.01) |
| H03F 3/16 | (2006.01) |

(52) U.S. Cl.
CPC ........... *H03M 1/466* (2013.01); *H03F 1/0205* (2013.01); *H03F 3/16* (2013.01); *H03F 2200/366* (2013.01)

(58) Field of Classification Search
CPC ........ H03M 1/66; H03M 1/06; H03M 1/466; H03F 1/0205; H03F 3/16; H03K 3/356139
USPC .......... 341/150–165; 326/56, 57, 58; 331/47
See application file for complete search history.

(56) References Cited

U.S. PATENT DOCUMENTS

| 5,293,081 | A | * | 3/1994 | Chiao | G06F 7/57 326/83 |
| 5,834,974 | A | * | 11/1998 | Kim | G11C 7/062 327/52 |
| 5,946,253 | A | * | 8/1999 | Fujiwara | G11C 7/065 365/189.04 |
| 6,459,299 | B1 | * | 10/2002 | Hirano | H03K 3/356139 326/56 |
| 6,473,349 | B1 | * | 10/2002 | Flannagan | G11C 7/065 365/205 |
| 2011/0037524 | A1 | * | 2/2011 | Dao | H03B 5/362 331/47 |
| 2012/0306553 | A1 | * | 12/2012 | Kim | G04F 10/005 327/158 |
| 2015/0194973 | A1 | * | 7/2015 | Furuta | H03M 1/002 348/308 |
| 2015/0303919 | A1 | * | 10/2015 | Zhou | H03M 1/66 341/144 |

OTHER PUBLICATIONS

Tsai, et al.; "A 1-V, 8b, 40MS/s, 113μW Charge-Recycling SAR ADC with a 14μW Asynchronous Controller"; 2011 Symposium on VLSI Circuits Digest of Technical Papers; pp. 264-265.

* cited by examiner

*Primary Examiner* — Lam T Mai
(74) *Attorney, Agent, or Firm* — McClure, Qualey & Rodack, LLP

(57) ABSTRACT

A preamplifier circuit comprising six transistors is provided. The first transistor is coupled to a power supply line and the second transistor is coupled to a ground line. The first and second transistors are controlled by an enable signal. The third and fourth transistors are connected between the first and second transistors, for generating a first amplifier output signal in response to a first input signal. The fifth and sixth transistors are connected between the first and second transistors, for generating a second amplifier output signal in response to a second input signal. The first, third, and fifth transistors are of a first conductivity type, and the second, fourth, and sixth transistors are of a second conductivity type. The preamplifier circuit can be applied to any type of ADC that utilizes a comparator.

27 Claims, 17 Drawing Sheets

PREAMPLIFIER CIRCUIT AND SAR ADC USING THE SAME

This application claims the benefit of U.S. provisional application Ser. No. 62/198,330, filed Jul. 29, 2015, the subject matter of which is incorporated herein by reference.

FIELD OF THE INVENTION

The present invention relates to a successive approximation register (SAR) analog to digital converter (ADC), and more particularly, to a preamplifier circuit used in a SAR ADC.

BACKGROUND OF THE INVENTION

ADC is a key building block of modern signal/audio/video processing circuits and communication circuits. Comparators that compare the difference between input signals have been widely used in ADC, such as flash ADC and SAR ADC. A general dynamic comparator is dynamically switched between a reset phase and a comparing phase. The dynamic comparator may include a preamplifier circuit and a latch circuit. The preamplifier circuit is used to amplify input signals and apply its output signals to the latch circuit, so that the sensitivity of the comparator can be improved. The performance of a comparator can be evaluated based on power consumption and operating speed. In this regard, there is a need for a comparator with low power consumption and high speed operation.

SUMMARY OF THE INVENTION

The disclosure is directed to a preamplifier circuit that may be used in an ADC. One of the advantages of the proposed preamplifier circuit is enhanced throughput of the conversion process.

According to one embodiment, a preamplifier circuit is provided. The preamplifier circuit generates a first amplifier output signal and a second amplifier output signal in response to a first input signal, a second input signal, and an enable signal. The preamplifier circuit includes six transistors. The first transistor has a control terminal coupled to the enable signal, a first terminal coupled to a power supply line, and a second terminal. The second transistor has a control terminal coupled to the enable signal, a first terminal coupled to a ground line, and a second terminal. The third transistor has a control terminal coupled to the first input signal, a first terminal coupled to the second terminal of the first transistor, a second terminal coupled to the first amplifier output signal. The fourth transistor has a control terminal coupled to the first input signal, a first terminal coupled to the second terminal of the second transistor, a second terminal coupled to the first amplifier output signal. The fifth transistor has a control terminal coupled to the second input signal, a first terminal coupled to the second terminal of the first transistor, a second terminal coupled to the second amplifier output signal. The sixth transistor has a control terminal coupled to the second input signal, a first terminal coupled to the second terminal of the second transistor, a second terminal coupled to the second amplifier output signal. The first, third, and fifth transistors are of a first conductivity type, and the second, fourth, and sixth transistors are of a second conductivity type.

According to one embodiment, a SAR ADC is provided. The SAR ADC generates a digital code with N bits in response to a differential input signal, where N is a positive integer. The SAR ADC includes N data drivers, a digital to analog converter (DAC), a preamplifier circuit, a first latch circuit, a second latch circuit, and a self-ring logic circuit. Each of the N data drivers stores one bit of the digital code. The DAC samples the differential input signal. The DAC is driven by the N data drivers to generate a first input signal and a second input signal. The preamplifier circuit generates a first amplifier output signal and a second amplifier output signal in response to a first input signal, a second input signal, and an enable signal. The preamplifier circuit includes six transistors. The first transistor has a control terminal coupled to the enable signal, a first terminal coupled to a power supply line, and a second terminal. The second transistor has a control terminal coupled to the enable signal, a first terminal coupled to a ground line, and a second terminal. The third transistor has a control terminal coupled to the first input signal, a first terminal coupled to the second terminal of the first transistor, a second terminal coupled to the first amplifier output signal. The fourth transistor has a control terminal coupled to the first input signal, a first terminal coupled to the second terminal of the second transistor, a second terminal coupled to the first amplifier output signal. The fifth transistor has a control terminal coupled to the second input signal, a first terminal coupled to the second terminal of the first transistor, a second terminal coupled to the second amplifier output signal. The sixth transistor has a control terminal coupled to the second input signal, a first terminal coupled to the second terminal of the second transistor, a second terminal coupled to the second amplifier output signal. The first, third, and fifth transistors are of a first conductivity type, and the second, fourth, and sixth transistors are of a second conductivity type. The first latch circuit is coupled between the preamplifier circuit and at least one of the data drivers. The second latch circuit is coupled between the preamplifier circuit and at least another one of the data drivers. The self-ring logic circuit is configured to generate the enable signal.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

Figure 1:
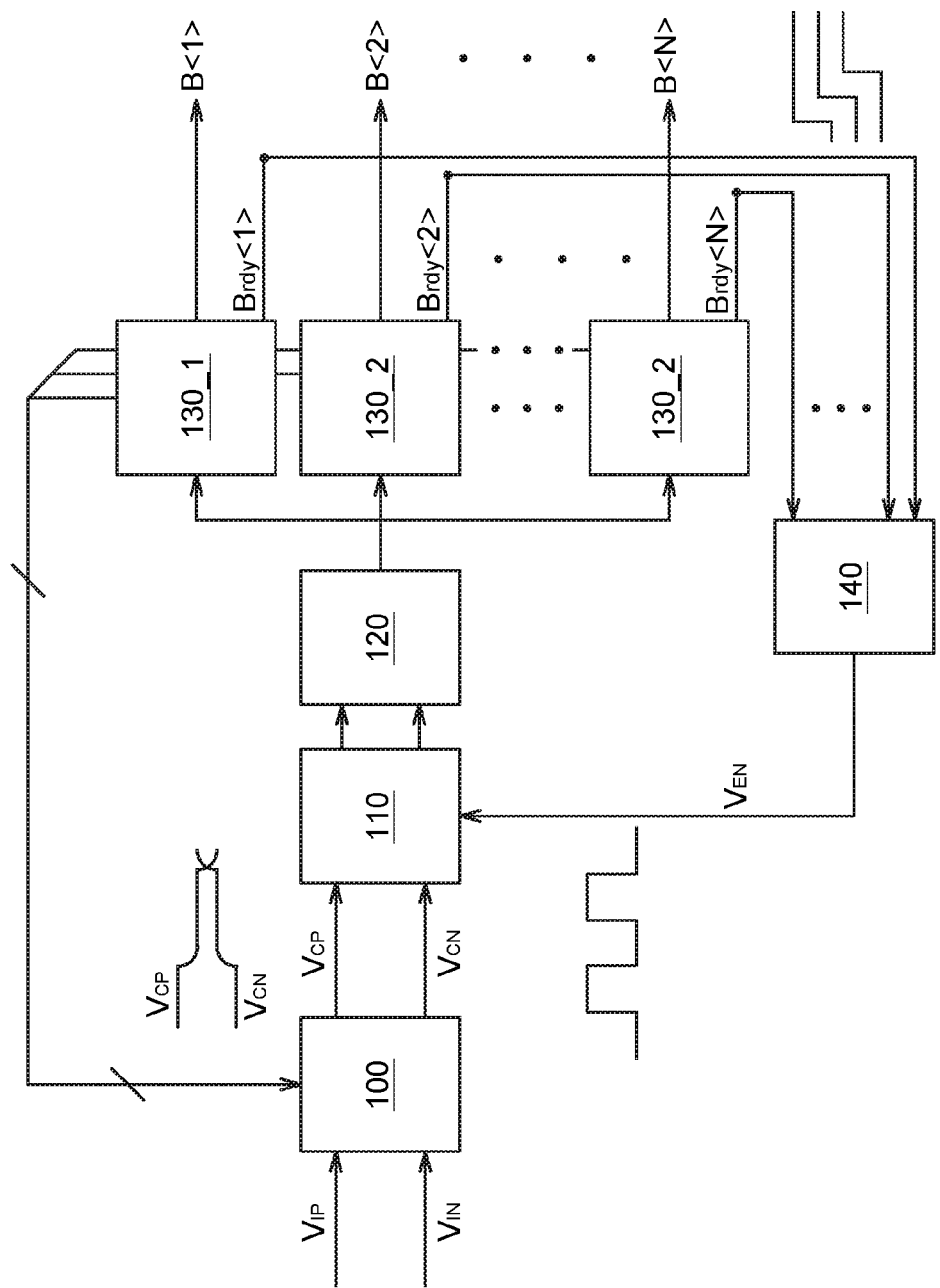
FIG. 1 illustrates a block diagram of a SAR ADC according to an embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION OF PREFERRED EMBODIMENTS

FIG. 1 illustrates a block diagram of a SAR ADC according to an embodiment of the invention. The SAR ADC 1 generates a digital code with N bits B<1>-B<N> in response to a differential input signal $V_{IP}$ and $V_{IN}$. The SAR ADC 1 includes a DAC 100, a preamplifier circuit 110, a latch circuit 120, data drivers 130_1-130_N, and a self-ring logic circuit 140. Each of the data drivers 130_1-130_N stores one bit of the digital code that represents a conversion result of the SAR ADC 1. The DAC 100 may be implemented by charge redistribution DAC. The operation of the SAR ADC 1 may be divided into a sampling phase and a conversion phase. During the sampling phase, the DAC 100 samples the differential input signal differential input signal $V_{IP}$ and $V_{IN}$ to generate a first input signal $V_{CP}$ and a second input signal $V_{CN}$. During the conversion phase, the DAC 100 is driven by the N data drivers 130_1-130_N to generate the first input signal $V_{CP}$ and the second input signal $V_{CN}$. The DAC 100 may for example include a switched capacitor array, which is controlled by the N data drivers 130_1-130_N.

The preamplifier circuit 110 and the latch circuit 120 effectively form a dynamic comparator, whose operation is switched between a reset phase and a comparing phase. The SAR ADC 1 in this example is an asynchronous SAR ADC. In other words, the preamplifier circuit 110 is controlled by an enable signal $V_{EN}$ generated by the self-ring logic circuit 140. The self-ring logic circuit 140 may determine the enable signal $V_{EN}$ according to the state of the N data drivers 130_1-130_N. For example, each of the N data drivers 130_1-130_N may generate a bit ready signal $B_{rdy}<1>$-$B_{rdy}<N>$ to indicate a conversion state of a corresponding bit of the digital code. For a SAR ADC, the digital code may be generated in sequence from the most significant bit (MSB) to the least significant bit (LSB). When the conversion procedure for one bit of the digital code has been completed, the self-ring logic circuit 140 may inform the preamplifier circuit 110 to reset and prepare for the comparison procedure for the next bit (as opposed to a synchronous SAR ADC where the preamplifier circuit 110 is switched between the reset phase and the comparing phase periodically according to a clock signal).

Figure 2:
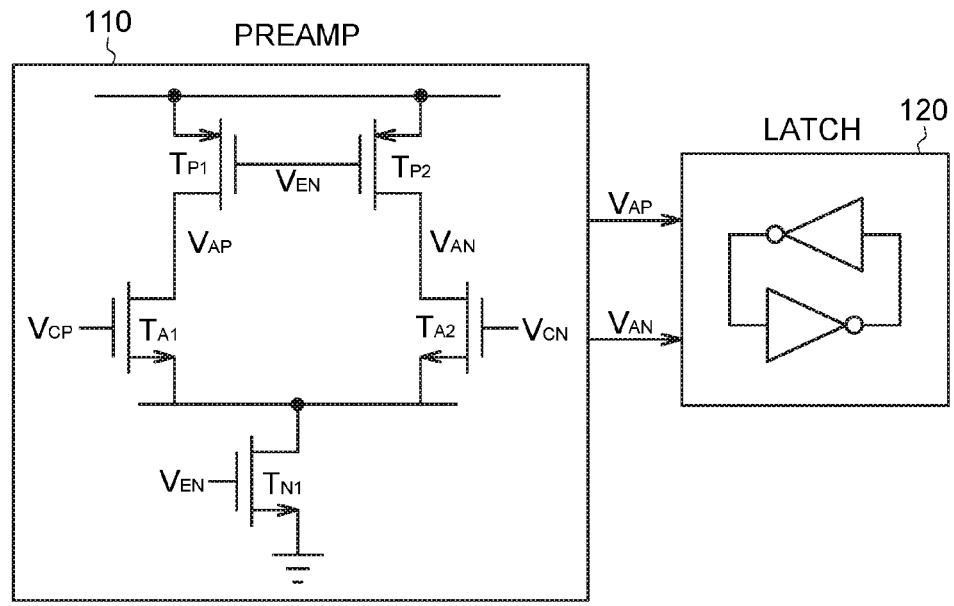
FIG. 2 illustrates a circuit diagram of an example comparator used in the SAR ADC 1.

FIG. 2 illustrates a circuit diagram of an example comparator used in the SAR ADC 1, where the comparator includes the preamplifier circuit 110 and the latch circuit 120. One example of the latch circuit 120 is implemented by back-to-back CMOS inverters, producing a positive feedback loop to constitute a bistable circuit that converts a small input-voltage difference to a full-scale digital output. The preamplifier circuit 110 includes a pair of transistors $T_{A1}$ and $T_{A2}$ for receiving the first input signal $V_{CP}$ and the second input signal $V_{CN}$. The pair of transistors $T_{A1}$ and $T_{A2}$ is configured to amplify the first input signal $V_{CP}$ and the second input signal $V_{CN}$ to generate a first amplifier output signal $V_{AP}$ and a second amplifier output signal $V_{AN}$. The enable signal $V_{EN}$ controls the on/off state of transistors $T_{P1}$, $T_{P2}$, and $T_{N1}$.

Figure 3:
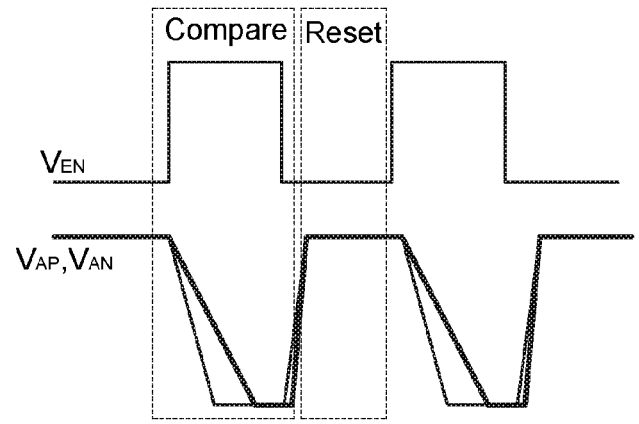
FIG. 3 illustrates a signal waveform of the comparator used in the SAR ADC 1.

FIG. 3 illustrates a signal waveform of the comparator used in the SAR ADC 1. Referring to the preamplifier 110 shown in FIG. 2, the operation of the preamplifier circuit 110 may be controlled by the enable signal $V_{EN}$. When the enable signal $V_{EN}$ is at low logic level (low logic level or ground voltage level will be represented as "low" in the following description), the transistor $T_{N1}$ (NMOS) is turned off and the transistors $T_{P1}$ and $T_{P2}$ (PMOS) are turned on such that the first amplifier output signal $V_{AP}$ and the second amplifier output signal $V_{AN}$ are precharged to a voltage level close to the supply voltage. This is the reset phase ($V_{EN}$=low) in which the first amplifier output signal $V_{AP}$ and the second amplifier output signal $V_{AN}$ are reset to the same high voltage level. A charge current is provided from the supply voltage to charge the first amplifier output signal $V_{AP}$ and the second amplifier output signal $V_{AN}$, and thus the preamplifier 110 consumes energy.

When the enable signal $V_{EN}$ is at high logic level (high logic level or supply voltage level will be represented as "high" in the following description), the transistors $T_{P1}$ and $T_{P2}$ are turned off and the transistor $T_{N1}$ is turned on. The first input signal $V_{CP}$ and the second input signal $V_{CN}$ affect the on-resistance of the transistors $T_{A1}$ and $T_{A2}$ and hence create different discharge currents flowing through the transistors $T_{A1}$ and $T_{A2}$. The first amplifier output signal $V_{AP}$ and the second amplifier output signal $V_{AN}$ are discharged with different rates. This is the comparing phase ($V_{EN}$=high) in which the voltage difference between the first input signal $V_{CP}$ and the second input signal $V_{CN}$ is pre-amplified to generate the first amplifier output signal $V_{AP}$ and the second amplifier output signal $V_{AN}$, which are coupled to the latch circuit 120 to quickly generate the comparator output being either logic 1 or logic 0. Because the transistor $T_{P1}$ and $T_{P2}$ are turned off, no current is provided from the supply voltage and hence there is no power consumption in the comparing phase (neglecting leakage current).

Figure 4:
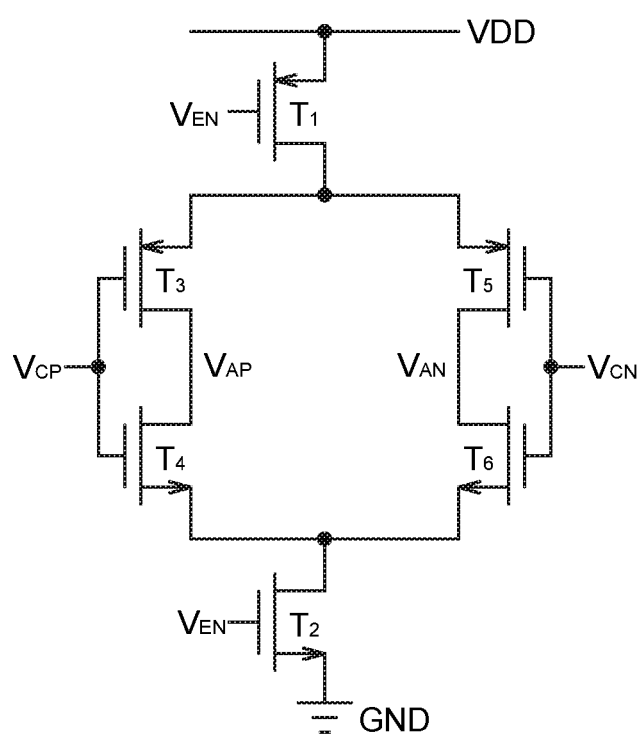
FIG. 4 illustrates a circuit diagram of a preamplifier circuit according to an embodiment of the invention.

FIG. 4 illustrates a circuit diagram of a preamplifier circuit 210 according to an embodiment of the invention. The preamplifier circuit 210 may be used to replace the preamplifier circuit 110 shown in FIG. 1. The preamplifier circuit 210 generates a first amplifier output signal $V_{AP}$ and a second amplifier output signal $V_{AN}$ in response to a first input signal $V_{CP}$, a second input signal $V_{CN}$, and an enable signal $V_{EN}$. The preamplifier circuit 210 includes six transistors $T_1$-$T_6$. The first transistor $T_1$ has a control terminal coupled to the enable signal $V_{EN}$, a first terminal coupled to a power supply line VDD, and a second terminal. The second transistor $T_2$ has a control terminal coupled to the enable signal $V_{EN}$, a first terminal coupled to a ground line GND, and a second terminal. The third transistor $T_3$ has a control terminal coupled to the first input signal $V_{CP}$, a first terminal coupled to the second terminal of the first transistor $T_1$, a second terminal coupled to the first amplifier output signal $V_{AP}$. The fourth transistor $T_4$ has a control terminal coupled to the first input signal $V_{CP}$, a first terminal coupled to the second terminal of the second transistor $T_2$, a second terminal coupled to the first amplifier output signal $V_{AP}$. The fifth transistor $T_5$ has a control terminal coupled to the second input signal $V_{CN}$, a first terminal coupled to the second terminal of the first transistor $T_1$, a second terminal coupled to the second amplifier output signal $V_{AN}$. The sixth transistor $T_6$ has a control terminal coupled to the second input signal $V_{CN}$, a first terminal coupled to the second terminal of the second transistor $T_2$, a second terminal coupled to the second amplifier output signal $V_{AN}$. The first, third, and fifth transistors $T_1$, $T_3$, and $T_5$ are of a first conductivity type, and the second, fourth, and sixth transistors $T_2$, $T_4$, and $T_6$ are of a second conductivity type. In the example shown in FIG. 4, the first conductivity type is a PMOS transistor and the second conductivity type is a NMOS transistor. Also in this example the control terminal, the first terminal, and the second terminal of a MOS transistor represent the gate terminal, the source terminal, and the drain terminal of the MOS transistor, respectively.

Figure 5A:
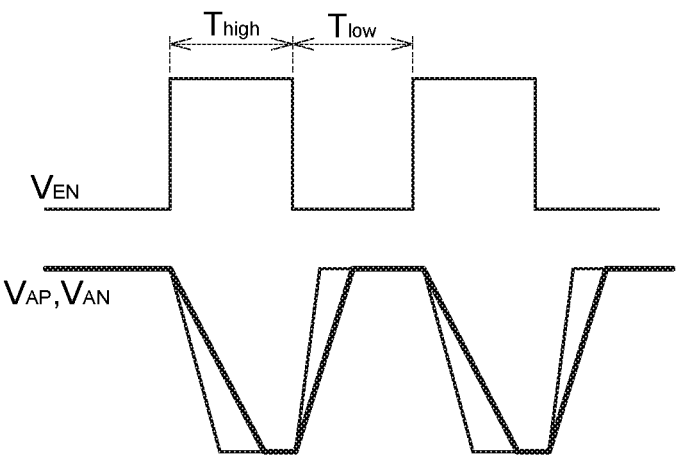
FIG. 5A and FIG. 5B illustrate signal waveforms of a comparator that utilizes the preamplifier circuit according to an embodiment of the invention.

FIG. 5A illustrates a signal waveform of a comparator that utilizes the preamplifier circuit 210 according to an embodiment of the invention. Similar to the circuit shown in FIG. 2, the first amplifier output signal $V_{AN}$ and the second amplifier output signal $V_{AP}$ of the preamplifier circuit 210 may be coupled to a latch circuit to convert a small input-voltage difference to a full-scale digital output. In the example shown in FIG. 5A, initially both the first amplifier output signal $V_{AN}$ and the second amplifier output signal $V_{AP}$ are high. When the enable signal $V_{EN}$ switches to high, the first transistor $T_1$ is turned off and the second transistor $T_2$ is turned on. The first input signal $V_{CP}$ and the second input signal $V_{CN}$ affect the on-resistance of the fourth transistors $T_4$ and the sixth transistor $T_6$ and hence create different discharge currents flowing through the fourth transistors $T_4$ and the sixth transistor $T_6$. The first amplifier output signal $V_{AP}$ and the second amplifier output signal $V_{AN}$ are discharged with different rates to compare the first input signal $V_{CP}$ and the second input signal $V_{CN}$. The first amplifier output signal $V_{AP}$ and the second amplifier output signal $V_{AN}$ are then both discharged to low. In the period $T_{high}$, because there is no current provided from the power supply line VDD, there is no power consumption (neglecting leakage current).

Next, when the enable signal $V_{EN}$ switches to low, the first transistor $T_1$ is turned on and the second transistor $T_2$ is turned off. The first input signal $V_{CP}$ and the second input signal $V_{CN}$ affect the on-resistance of the third transistors $T_3$ and the fifth transistor $T_5$ and hence create different charge currents flowing through the third transistors $T_3$ and the fifth transistor $T_5$. The first amplifier output signal $V_{AP}$ and the second amplifier output signal $V_{AN}$ are charged with different rates to compare the first input signal $V_{CP}$ and the second input signal $V_{CN}$. The first amplifier output signal $V_{AP}$ and the second amplifier output signal $V_{AN}$ are then both charged to high. In the period $T_{low}$, because the charge current is provided from the power supply line VDD, there is power consumption.

Figure 5B:
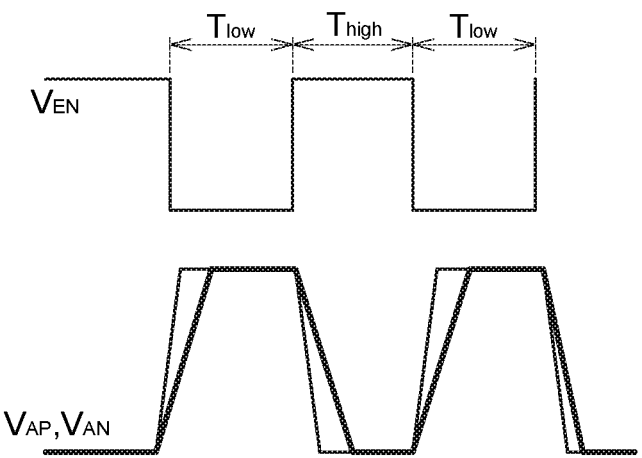

FIG. 5B illustrates another signal waveform of a comparator that utilizes the preamplifier circuit 210 according to an embodiment of the invention. In the example shown in FIG. 5B, initially both the first amplifier output signal $V_{AN}$ and the second amplifier output signal $V_{AP}$ are low. The charging and discharging operations controlled by the enable signal $V_{EN}$ are similar to those described above. In the period $T_{high}$, the first amplifier output signal $V_{AP}$ and the second amplifier output signal $V_{AN}$ are discharged to low. There is no power consumption in the period $T_{high}$. In the period $T_{low}$, the first amplifier output signal $V_{AP}$ and the second amplifier output signal $V_{AN}$ are charged to high, and there is power consumption.

As the examples shown in FIG. 5A and FIG. 5B, there is no clear distinction between the reset phase and the comparing phase for the preamplifier circuit 210. In the period $T_{high}$, the first amplifier output signal $V_{AP}$ and the second amplifier output signal $V_{AN}$ are discharged to produce the comparison result and also discharged to equal low voltage level. That is, reset (for the next $T_{low}$ cycle) and comparing are both performed in the period $T_{high}$. Also in the period $T_{low}$, the first amplifier output signal $V_{AP}$ and the second amplifier output signal $V_{AN}$ are charged to produce the comparison result and also charged to equal high voltage level. Reset (for the next $T_{high}$ cycle) and comparing are both performed in the period $T_{low}$.

Figure 6A:
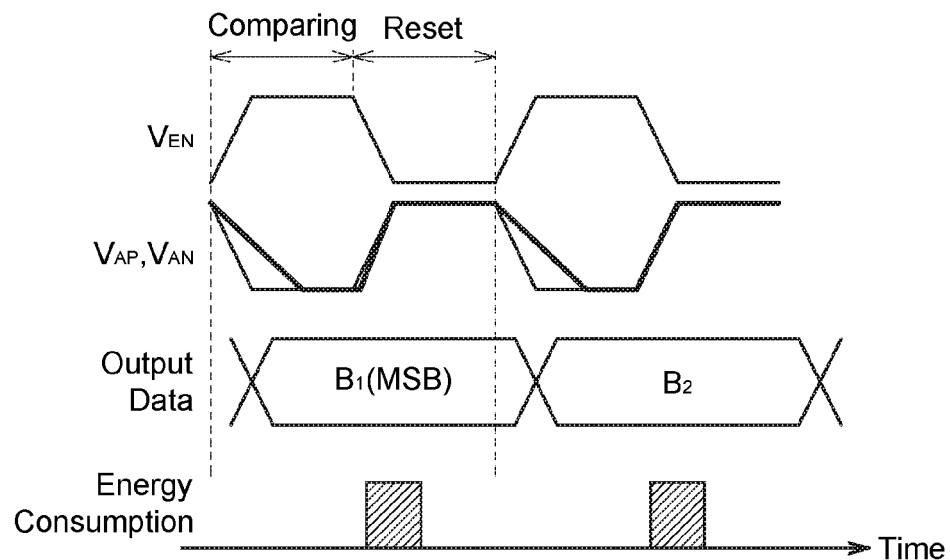
FIG. 6A illustrates a signal waveform of the preamplifier circuit 110.

FIG. 6A illustrates a signal waveform of the preamplifier circuit 110. Referring to the signal waveform shown in FIG. 3, one comparing phase and one reset phase constitute a full cycle of the enable signal $V_{EN}$. Therefore, each bit of the ADC conversion result requires one full cycle of the enable signal $V_{EN}$ (from one rising edge to another rising edge of the enable signal $V_{EN}$). Energy is consumed in every reset phase.

Figure 6B:
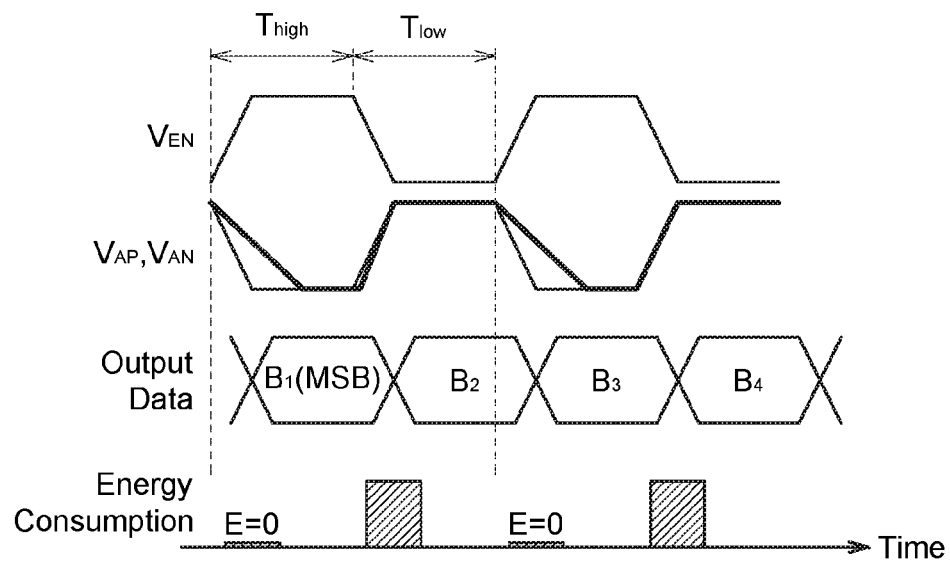
FIG. 6B illustrates a signal waveform of the preamplifier circuit 210 according to an embodiment of the invention.

FIG. 6B illustrates a signal waveform of the preamplifier circuit 210 according to an embodiment of the invention. Referring to the signal waveforms shown in FIG. 5A and FIG. 5B. For each full cycle of the enable signal $V_{EN}$, two bits of the ADC conversion result can be produced (with one bit produced in the period $T_{high}$ and the other bit produced in the period $T_{low}$). Therefore, the preamplifier circuit 210 shown in FIG. 4 doubles the conversion throughput of the ADC (two bits per cycle) as compared to the preamplifier circuit 110 shown in FIG. 2 (one bit per cycle).

Furthermore, as shown in FIG. 6A, energy is consumed in the reset phase. That is, power consumption is required for every bit conversion. However, in FIG. 6B, energy is consumed in the period $T_{low}$, that is, only a half number of the bit conversions require power consumption. Assume the energy consumption in the reset phase of FIG. 6A and the energy consumption in the period $T_{low}$ of FIG. 6B are both equal to p joules. For an N-bit ADC, it takes the preamplifier circuit 110 a total of N cycles and N*p joules for converting N bits, while it takes the preamplifier circuit 210 only (N/2) cycles and (N/2)*p joules for converting N bits. For the preamplifier circuit 210, the conversion throughput is doubled, and the total energy consumed is halved.

In the embodiment given above, the SAR ADC is taken as an example. However, the preamplifier circuit 210 may also be applied to any other type of ADC that utilizes a comparator, such as a flash ADC. In addition, an asynchronous SAR ADC is taken as an example. However, the preamplifier circuit 210 may also be applied in a synchronous SAR ADC by feeding a periodic clock signal as the enable signal $V_{EN}$. In addition, the operation of the preamplifier circuit 210 is not limited to the enable signal $V_{EN}$ starting in high state. The enable signal $V_{EN}$ may also start in low state. Signal polarities of the enable signal $V_{EN}$, the first amplifier output signal $V_{AP}$, and the second amplifier output signal $V_{AN}$ may be designed appropriately depending on the circuit application.

Figure 7:
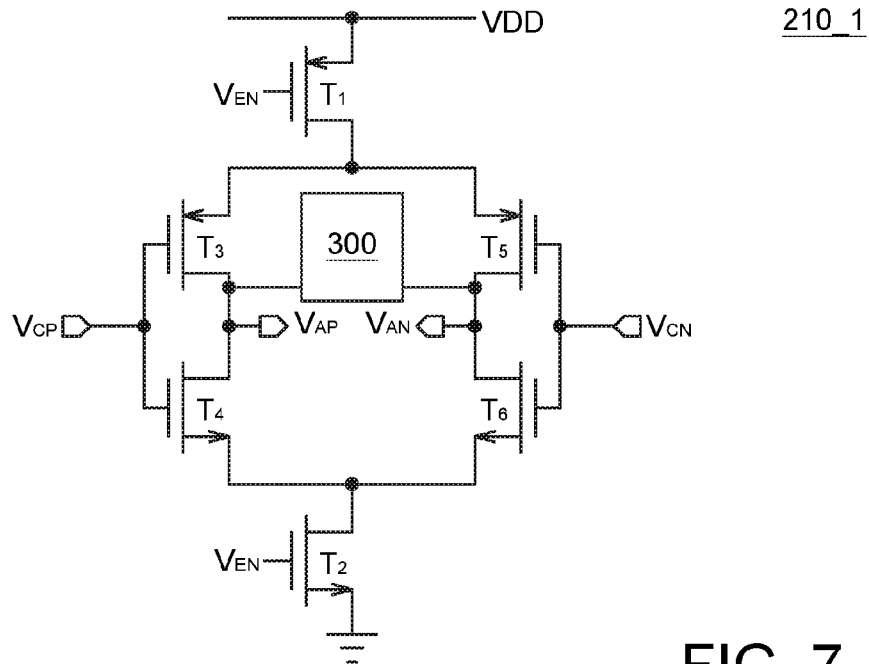
FIG. 7 illustrates a circuit diagram of a preamplifier circuit that includes a reset circuit according to an embodiment of the invention.

For the preamplifier circuit 210, because the comparing operation and the reset operation happen in the same period, an auxiliary reset circuit may be added to make sure the reset operation is successfully performed. FIG. 7 illustrates a circuit diagram of a preamplifier circuit that includes a reset circuit according to an embodiment of the invention. The preamplifier circuit 210_1 includes a reset circuit 300. The reset circuit 300 is configured to equalize the first amplifier output signal $V_{AP}$ and the second amplifier output signal $V_{AN}$. For example, the reset circuit 300 may be coupled to the second terminal of the third transistor $T_3$ and the second terminal of the fifth transistor $T_5$. Because the first amplifier output signal $V_{AP}$ and the second amplifier output signal $V_{AN}$ are equalized (such as equalized to high or equalized to low), the reset operation is guaranteed to be successful. Therefore the comparing procedure for the next bit will not be affected by the result of the current bit, effectively removing the memory effect of a comparator.

Figure 8:
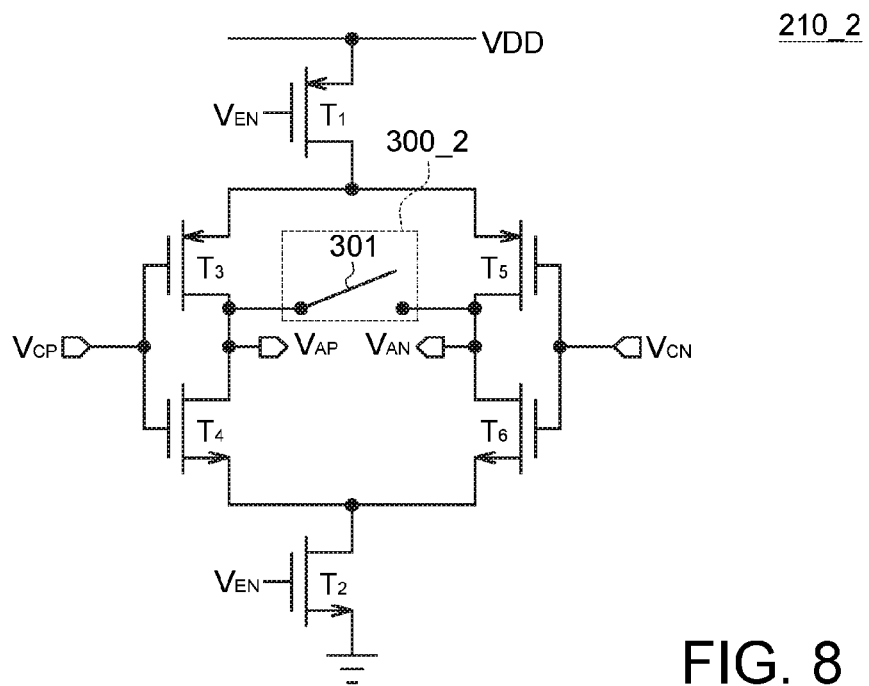
FIG. 8 illustrates a circuit diagram of a preamplifier circuit that includes a reset circuit according to an embodiment of the invention.

There may be several ways to implement the reset circuit 300. A number of embodiments regarding the reset circuit 300 are given below. FIG. 8 illustrates a circuit diagram of a preamplifier circuit 210_2 that includes a reset circuit 300_2 according to an embodiment of the invention. The reset circuit 300_2 includes a switch 301 coupled between the first amplifier output signal $V_{AP}$ and the second amplifier output signal $V_{AN}$. The first amplifier output signal $V_{AP}$ and the second amplifier output signal $V_{AN}$ are equalized when the switch 301 is closed. The state of the switch 301 may be controlled by a pulse signal. In one embodiment, the switch 301 may be implemented by a transmission gate.

Figure 9A:
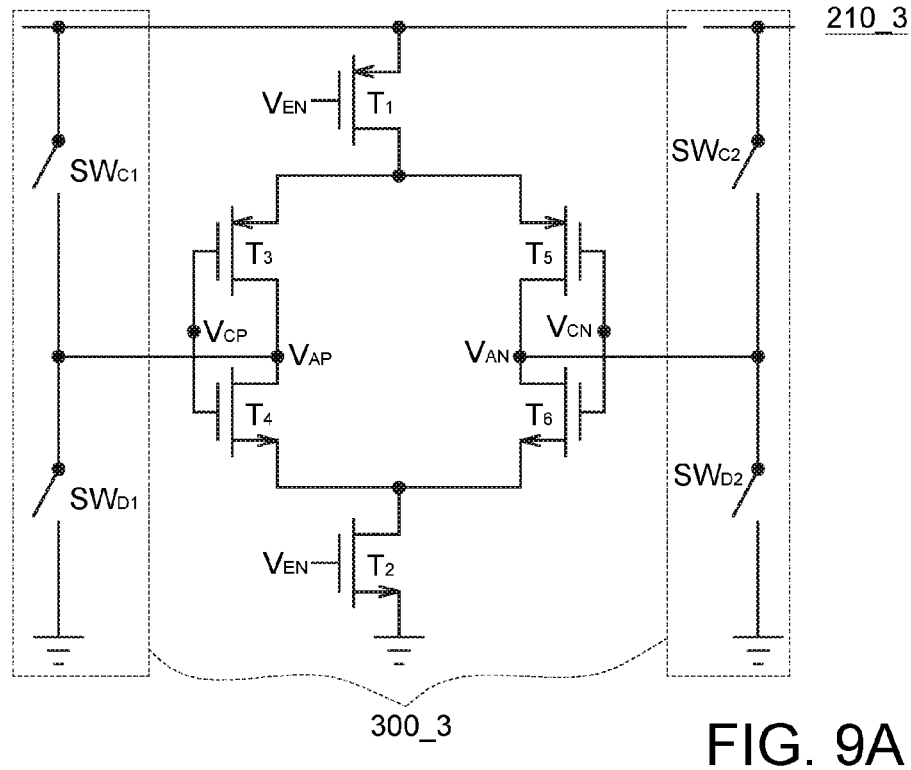
FIG. 9A and FIG. 9B illustrate circuit diagrams of the preamplifier circuits that include reset circuits having switches according to embodiments of the invention.
Figure 9B:
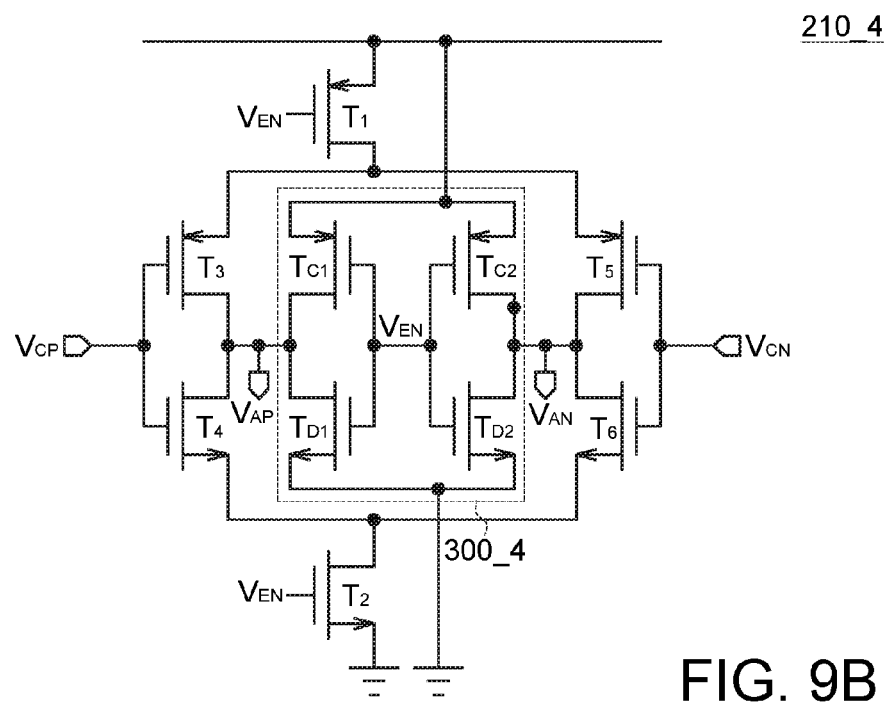

FIG. 9A and FIG. 9B illustrate circuit diagrams of the preamplifier circuits that include reset circuits having switches according to embodiments of the invention. In FIG. 9A, the reset circuit 300_3 includes a first charge switch $SW_{C1}$, a first discharge switch $SW_{D1}$, a second charge switch $SW_{C2}$, and a second discharge switch $SW_{D2}$. The first charge switch $SW_{C1}$ is coupled between the first amplifier output signal $V_{AP}$ and the power supply line VDD. The first discharge switch $SW_{D1}$ is coupled between the first amplifier output signal $V_{AP}$ and the ground line GND. The second charge switch $SW_{C2}$ is coupled between the second amplifier output signal $V_{AN}$ and the power supply line VDD. The second discharge switch $SW_{D2}$ is coupled between the second amplifier output signal $V_{AN}$ and the ground line GND. When the first charge switch $SW_{C1}$ and the second charge switch $SW_{C2}$ are closed, the first amplifier output signal $V_{AP}$ and the second amplifier output signal $V_{AN}$ are equalized to high. When the first charge switch $SW_{D1}$ and the second charge switch $SW_{D2}$ are closed, the first amplifier output signal $V_{AP}$ and the second amplifier output signal $V_{AN}$ are equalized to low.

In the reset circuit 300_4 shown FIG. 9B, the four switches may be implemented by four transistors. For example, the first charge switch $SW_{C1}$ is a PMOS transistor $T_{C1}$, the second charge switch $SW_{C2}$ is a PMOS transistor $T_{C2}$, the first discharge switch $SW_{D1}$ is a NMOS transistor $T_{D1}$, and the second discharge switch $SW_{D2}$ is a NMOS transistor $T_{D2}$. In one embodiment, the transistors $T_{C1}$, $T_{C2}$, $T_{D1}$, and $T_{D2}$ are controlled by the enable signal $V_{EN}$. In the period $T_{high}$, the transistors $T_{D1}$ and $T_{D2}$ are turned on, and the first amplifier output signal $V_{AP}$ and the second amplifier output signal $V_{AN}$ are equalized to low with the aid of the reset circuit 300_4. Similarly, in the period $T_{low}$, the transistors $T_{C1}$ and $T_{C2}$ are turned on, the first amplifier output signal $V_{AP}$ and the second amplifier output signal $V_{AN}$ are equalized to high.

Figure 10A:
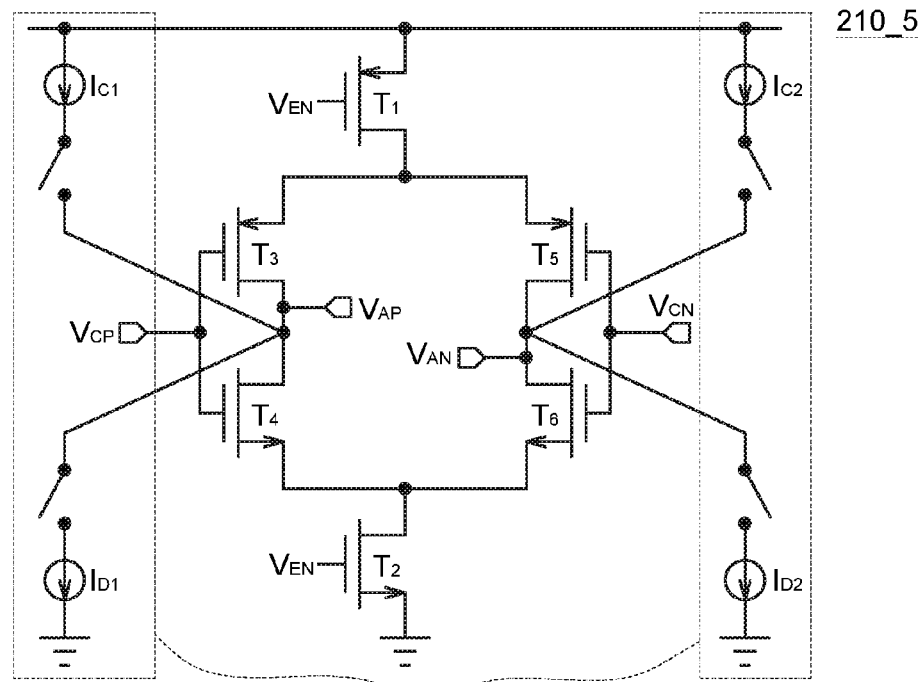
FIGS. 10A-10C illustrate circuit diagrams of the preamplifier circuits that include reset circuits having current sources according to embodiments of the invention.
Figure 10B:
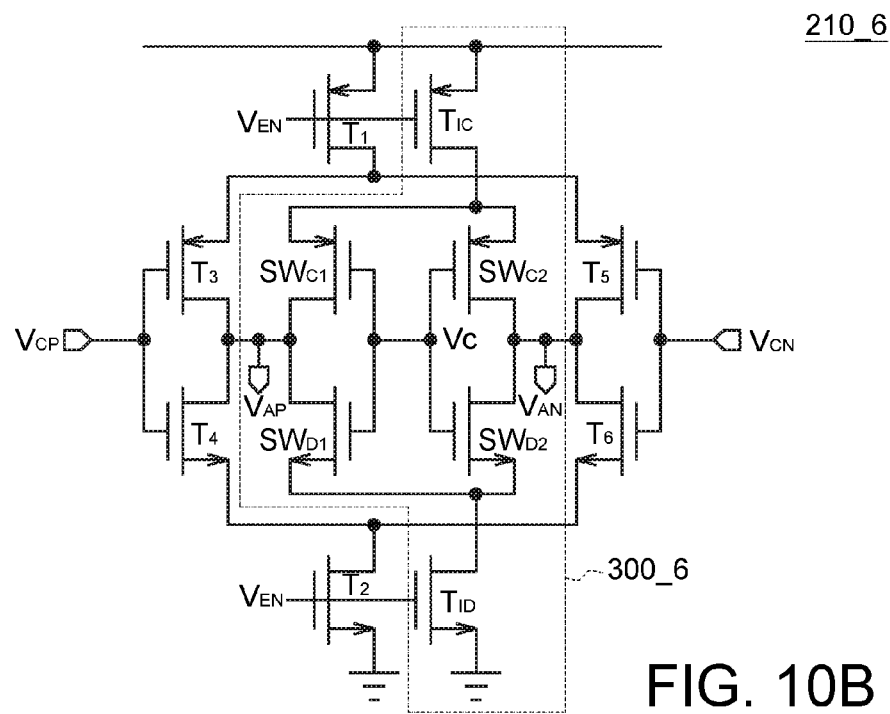
Figure 10C:
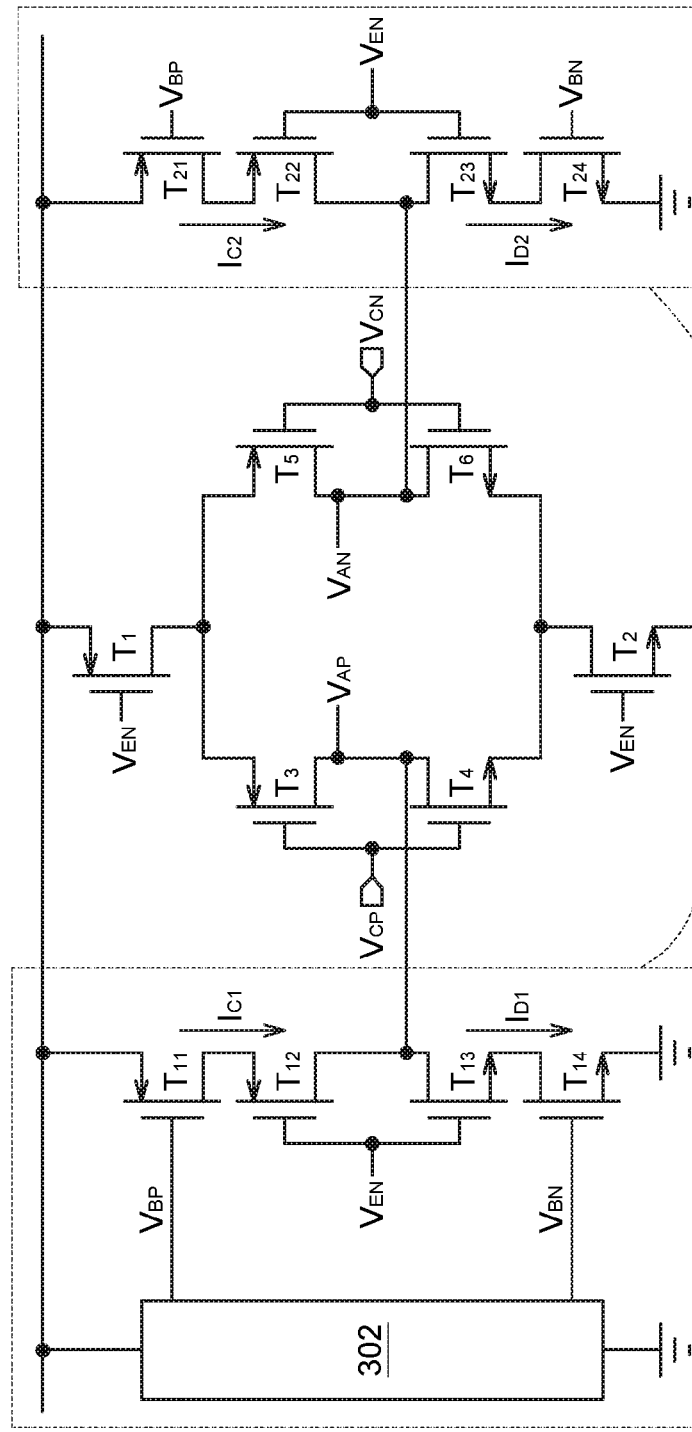

FIGS. 10A-10C illustrate circuit diagrams of the preamplifier circuits that include reset circuits having current sources according to embodiments of the invention. In FIG. 10A, the reset circuit 300_5 includes a charge current source $I_C$ coupled to the power supply line VDD, a discharge current source $I_D$ coupled to the ground line GND, a first charge switch $SW_{C1}$ coupled between the first amplifier output signal $V_{AP}$ and the charge current source $I_C$, a first discharge switch $SW_{D1}$ coupled between the first amplifier output signal $V_{AP}$ and the discharge current source $I_D$, a second charge switch $SW_{C2}$ coupled between the second amplifier output signal $V_{AN}$ and the charge current source $I_C$, and a second discharge switch $SW_{D2}$ coupled between the second amplifier output signal $V_{AN}$ and the discharge current source $I_D$. Note that the charge current source $I_C$ is illustrated as two separate current sources $I_{C1}$ and $I_{C2}$ in FIG. 10A for ease of illustration, and so is the discharge current source $I_D$. In circuit implementation, the first charge switch $SW_{C1}$ and the second charge switch $SW_{C2}$ may either be coupled to the same charge current source $I_C$ or different current sources $I_{C1}$ and $I_{C2}$ as shown in FIG. 10A. Similarly, the first discharge switch $SW_{D1}$ and the second discharge switch $SW_{D2}$ may either be coupled to the same discharge current source $I_D$ or different current sources $I_{D1}$ and $I_{D2}$ as shown in FIG. 10A.

Take the charge current source $I_C$ for example, in the preamplifier circuit 210_5 shown in FIG. 10A, a common mode current (the charge current source $I_C$) is injected to the output nodes (the first amplifier output signal $V_{AP}$ and the second amplifier output signal $V_{AN}$). In the period $T_{low}$, the first amplifier output signal $V_{AP}$ and the second amplifier output signal $V_{AN}$ are charged with different charging rates. Because of the injected common mode current (the charge current source $I_C$), the charging current for both the first amplifier output signal $V_{AP}$ and the second amplifier output signal $V_{AN}$ are increased, thereby making the first amplifier output signal $V_{AP}$ and the second amplifier output signal $V_{AN}$ both charged to high in a shorter amount of time. Similarly, in the period $T_{high}$, the common mode current (in this case, the discharge current source $I_D$) increases the discharging current for both the first amplifier output signal $V_{AP}$ and the second amplifier output signal $V_{AN}$, thereby making the first amplifier output signal $V_{AP}$ and the second amplifier output signal $V_{AN}$ both discharged to low in a shorter amount of time. Hence, the injected common mode currents, including the charge current source $I_C$ and the discharge current source $I_D$, speed up both the comparing and the reset operations.

FIG. 10B shows one circuit level implementation of the reset circuit shown in FIG. 10A. The charge current source $I_D$ includes a charge transistor $T_{IC}$ having a control terminal coupled to the enable signal $V_{EN}$. The discharge current source $I_D$ includes a discharge transistor $T_{ID}$ having a control terminal coupled to the enable signal $V_{EN}$. In addition, the first charge switch $SW_{C1}$, the first discharge switch $SW_{D1}$, the second charge switch $SW_{C2}$, and the second discharge switch $SW_{D2}$ may also be implemented by transistors. By utilizing transistors in the reset circuit 300_6, the ratio of the common mode current (injected current for the auxiliary reset operation) to the differential mode current (charge or discharge currents induced from the voltage between the first and second input signals $V_{CP}$ and $V_{CN}$) can be effectively controlled by setting the size ratio between the transistors. The magnitude of the injected common mode current can thus be appropriately designed to determine how much auxiliary current is added for the reset operation. In one embodiment, the first charge switch $SW_{C1}$, the first discharge switch $SW_{D1}$, the second charge switch $SW_{C2}$, and the second discharge switch $SW_{D2}$ are controlled by a control signal $V_C$. The control signal $V_C$ may be the enable signal $V_{EN}$, a constant voltage source such as being equal to VDD/2, or a controlled voltage source dependent on the first input signal $V_{CP}$ and the second input signal $V_{CN}$, such as $(V_{CP}+V_{CN})/2$.

FIG. 10O shows another circuit level implementation of the reset circuit shown in FIG. 10A. The reset circuit 300_7 includes a current mirror 302. Two lines showing signal $V_{BP}$ are tied together, and two lines showing signal $V_{BN}$ are tied together. The first charge current source $I_{C1}$, the second charge current source $I_{C2}$, the first discharge current source $I_{D1}$, and the second discharge current source $I_{D2}$ may be provided by the current mirror 302. Because of the circuit structure, the first charge current $I_{C1}$ flowing through transistors $T_{11}$ and $T_{12}$ is equal to the second charge current $I_{C2}$ flowing through transistors $T_{21}$ and $T_{22}$. Similarly, the first discharge current $I_{D1}$ flowing through transistors $T_{13}$ and $T_{14}$ is equal to the second discharge current $I_{D2}$ flowing through transistors $T_{23}$ and $T_{24}$. In addition, the first charge current $I_{C1}$ in the period $T_{low}$ is equal to the first discharge current $I_{D1}$ in the period $T_{high}$ because of the current mirror 302. The reset circuit 300_7 achieves a balanced common mode current injection.

Figure 11:
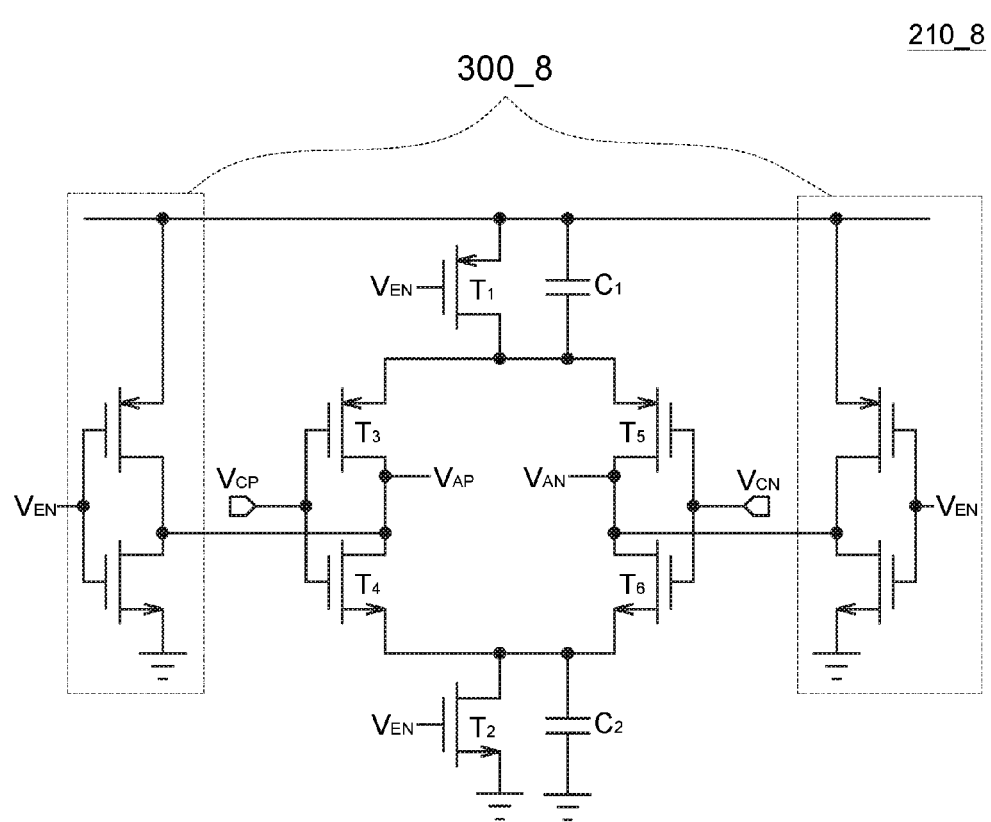
FIG. 11 illustrates a circuit diagram of a preamplifier circuit that includes a reset circuit and capacitors according to an embodiment of the invention.

FIG. 11 illustrates a circuit diagram of a preamplifier circuit that includes a reset circuit and capacitors according to an embodiment of the invention. The preamplifier circuit 210_8 includes a reset circuit 300_8, which includes four transistors controlled by the enable signal $V_{EN}$ in this example. The reset circuit 300_8 may also be replaced by any reset circuit shown in FIGS. 9A, 9B, 10A, 10B, and 10C. The preamplifier circuit 210_8 further includes a first capacitor $C_1$ and a second capacitor $C_2$. The first capacitor $C_1$ is coupled between the first terminal and the second terminal of the first transistor $T_1$. The second capacitor $C_2$ is coupled between the first terminal and the second terminal of the second transistor $T_2$. As described in the above embodiments, in the period $T_{low}$, the first transistor T1 is turned on, and the power supply line VDD provides a charge current flowing through the first transistor $T_1$ and the fifth transistor $T_5$. Because the second capacitor $C_2$ is added in the preamplifier circuit 210_8, there is also a current path from the second amplifier output signal $V_{AN}$ to the ground line GND. Thus the charge current provided from the supply line VDD flows through the first transistor $T_1$, the fifth transistor $T_5$, the sixth transistor $T_6$, and the second capacitor $C_2$. By utilizing the shared PN pair (the fifth transistor $T_5$ and the sixth transistor $T_6$), the effective total transconductance gm is increased, for example, $gm=gm_n+gm_p$, where $gm_n$ is the transconductance of the NMOS transistor $T_6$ and $gm_p$ is the transconductance of the PMOS transistor $T_5$. Increased total transconductance gm results in increased charge current, hence speeding up the operation of the preamplifier circuit 210_5. The discharge current is also increased because of the added first capacitor $C_1$, and the description is not repeated here. The advantage of this kind of switched capacitor current tail is a larger effective total transconductance gm. Furthermore, because the current flows through the shared PN pair, the mismatch concern between the PMOS transistor and the NMOS transistor for $T_{high}$ and $T_{low}$ cycles can be relaxed.

Figure 12:
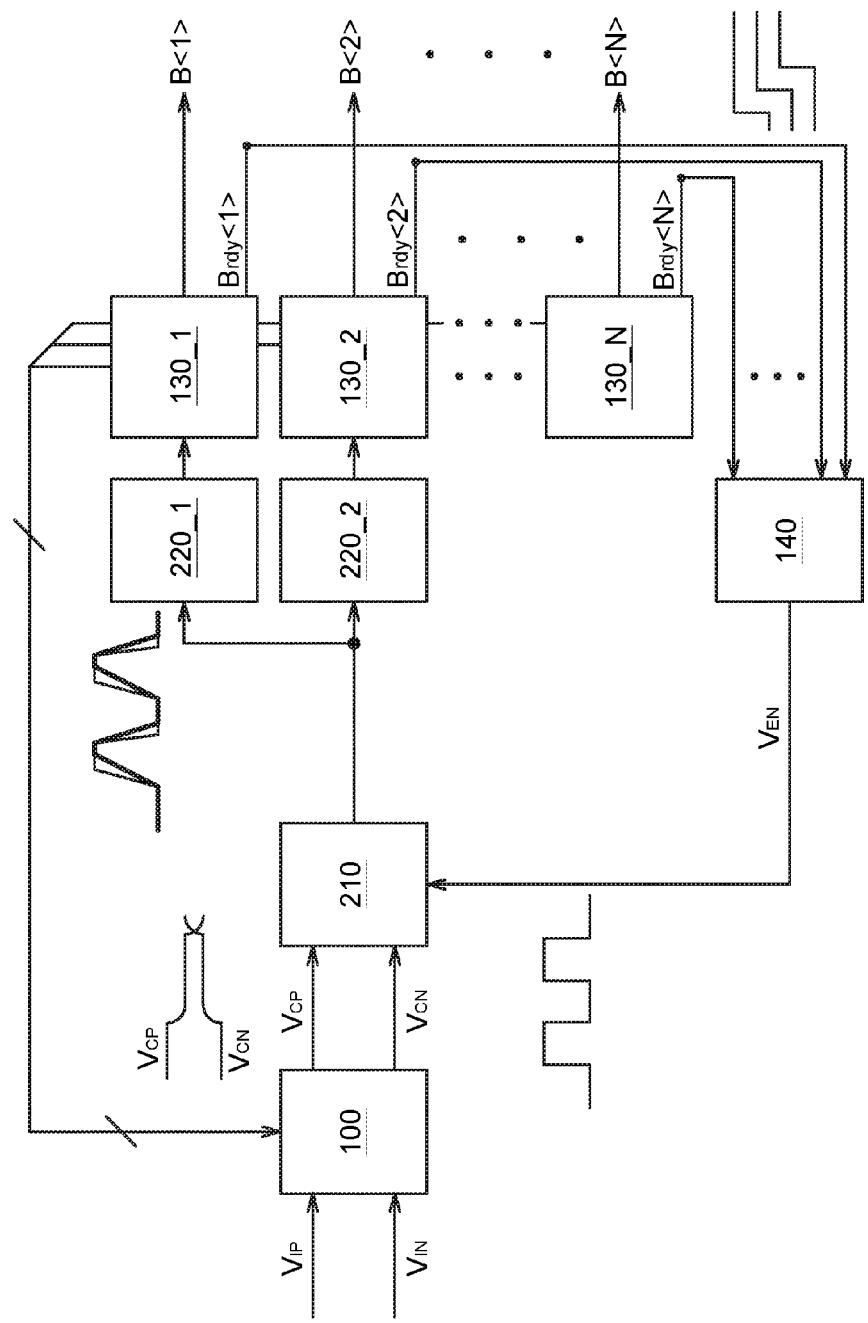
FIG. 12 illustrates a block diagram of the SAR ADC according to an embodiment of the invention.

FIG. 12 illustrates a block diagram of the SAR ADC 5 according to an embodiment of the invention. As compared to the SAR ADC 1 shown in FIG. 1, the preamplifier circuit 210 in the SAR ADC 5 is different from the preamplifier circuit 110 in the SAR ADC 1. The preamplifier circuit 210 may be any one of the embodiments shown in FIG. 4 and FIGS. 7-11. In addition, the latch circuit architecture corresponding to the preamplifier circuit 210 in the SAR ADC 5 is different from the latch circuit architecture in the SAR ADC 1. The SAR ADC 5 includes a first latch circuit 220_1 and a second latch circuit 220_2. The first latch circuit 220_1 is coupled between the preamplifier circuit 210 and at least one of the data drivers 130_1-130_N. The second latch circuit 220_2 is coupled between the preamplifier circuit 220 and at least another one of the data drivers 130_1-130_N. The first latch circuit 220_1 is different from the second latch circuit 220_2. In the embodiment shown in FIG. 12, the first latch circuit 220_1 is coupled to the data drivers 130_1 corresponding to bit 1 of the digital code B<1>, and the second latch circuit 220_2 is coupled to the data drivers 130_2 corresponding to bit 2 of the digital code B<2>. Note that the first latch circuit 220_1 may be coupled to more than one data drivers, and the second latch circuit 220_2 may also be coupled to more than one data drivers. Each of the data drivers 130_1-130_N shown in FIG. 12 may include one data storage element and one corresponding driver, where the data storage element stores one bit of the digital code B<1>-B<N>, and the driver provides the driving signal to the DAC 100. In one embodiment, the data drivers coupled to the first latch circuit 220_1 are different from the data drivers coupled to the second latch circuit 220_2.

Figure 13:
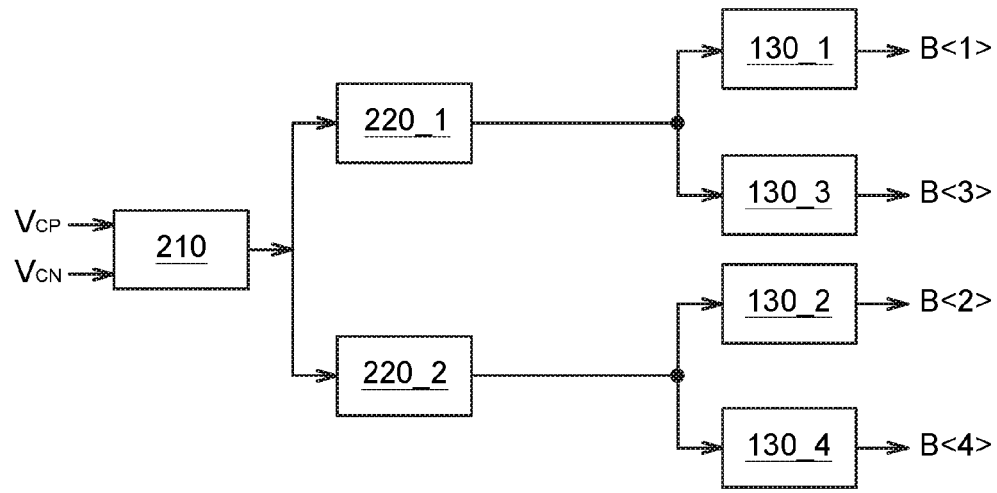
FIG. 13 illustrates a simplified block diagram of the SAR ADC according to an embodiment of the invention.

FIG. 13 illustrates a simplified block diagram of the SAR ADC according to an embodiment of the invention. The DAC 100 and the self-ring logic circuit 140 are omitted in this figure to clearly illustrate the latch architecture. In one embodiment, the first latch circuit 220_1 is coupled to data drivers corresponding to bits 1, 3, 5, . . . , N−1 of the digital code. The second latch circuit 220_2 is coupled to data drivers corresponding to bits 2, 4, 6, . . . , N of the digital code. Referring to the waveform shown in FIG. 6B, in the period $T_{high}$, bits 1, 3, 5, . . . , N−1 of the digital code are produced, In the period $T_{low}$, bits 2, 4, 6, . . . , N of the digital code are produced. In other words, the first latch circuit 220_1 and the second latch circuit 220_2 act in a time interleaved manner. When comparing input signals for generating the bit 1 B<1>, the first latch circuit 220_1 is used. When comparing input signals for generating the bit 2 B<2>, the second latch circuit 220_2 is used. Likewise, the first latch circuit 220_1 is used for bit 3 B<3>, the second latch circuit 220_2 is used for bit 4 B<4>, and so on.

Figure 14:
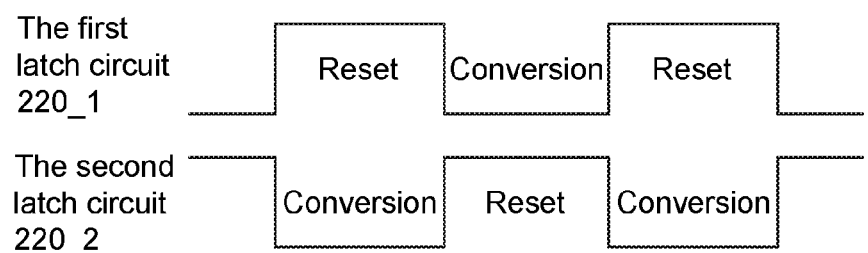
FIG. 14 illustrates different phases of the two different latch circuits shown in FIG. 13.

Also note that in the waveform shown in FIG. 6B, the first amplifier output signal $V_{AP}$ and the second amplifier output signal $V_{AN}$ are discharged in the period $T_{high}$, while the first amplifier output signal $V_{AP}$ and the second amplifier output signal $V_{AN}$ are charged in the period $T_{low}$. The first latch circuit 220_1 may be different from the second latch circuit 220_2 to accommodate different signal characteristics in these two periods. FIG. 14 illustrates different phases of the two different latch circuits shown in FIG. 13. By adopting different types of latches, the first latch circuit 220_1 is being reset when the second latch circuit 220_2 is performing conversion, and the latch circuit 220_1 is performing conversion when the second latch circuit 220_2 is being reset. Because of the nature of the different types of latches, the first latch circuit 220_1 and the second latch circuit 220_2 may be coupled to the same signals, while the corresponding phases in the first latch circuit 220_1 and the second latch circuit 220_2 may be time interleaved.

Figure 15:
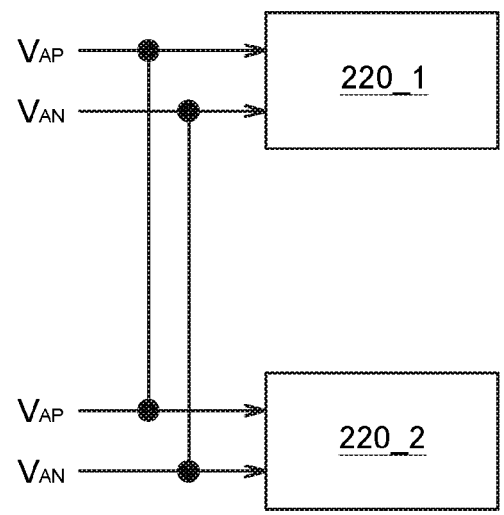
FIG. 15 illustrates a simplified block diagram of the preamplifier and the two latch circuits according to an embodiment of the invention.
Figure 16A:
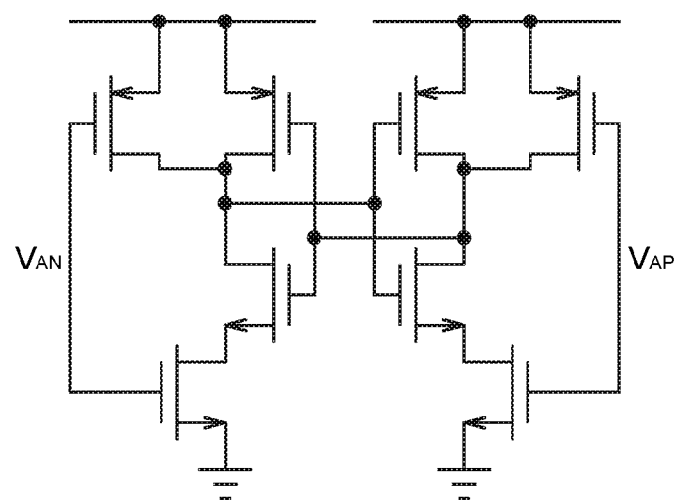
FIG. 16A illustrates a circuit diagram of a NAND type latch according to an embodiment of the invention.
Figure 16B:
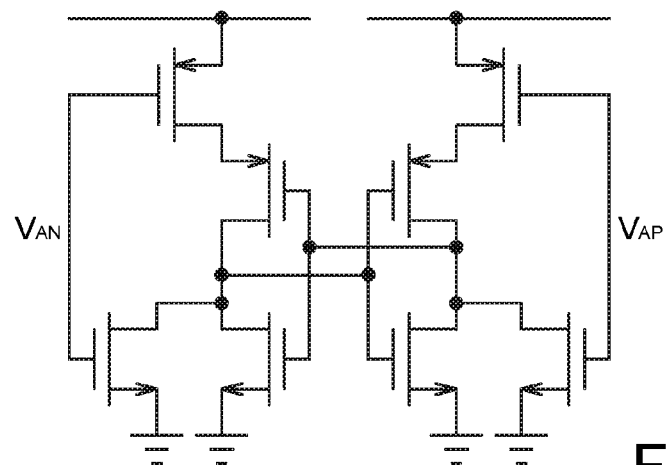
FIG. 16B illustrates a circuit diagram of a NOR type latch according to an embodiment of the invention.

FIG. 15 illustrates a simplified block diagram of the preamplifier and the two latch circuits according to an embodiment of the invention. In FIG. 15 only the first and second latch circuits 220_1 and 220_2 and their input signals are shown. The first latch circuit 220_1 and the second latch circuit 220_2 receive the same signals, which are the first amplifier output signal $V_{AP}$ and the second amplifier output signal $V_{AN}$. In one embodiment, the first latch circuit 220_1 is a rising-edge triggered latch, and the second latch circuit 220_2 is a falling-edge triggered latch. In one embodiment, the first latch circuit 220_1 is a NAND type latch, and the second latch circuit 220_2 is a NOR type latch. FIG. 16A illustrates a circuit diagram of a NAND type latch according to an embodiment of the invention. FIG. 16B illustrates a circuit diagram of a NOR type latch according to an embodiment of the invention. The invention is not limited to the specific latch types adopted. As described above, the first latch circuit 220_1 and the second latch circuit 220_2 that act in a time interleaved manner in response to the same signals may be applicable in the SAR ADC 5.

Figure 17:
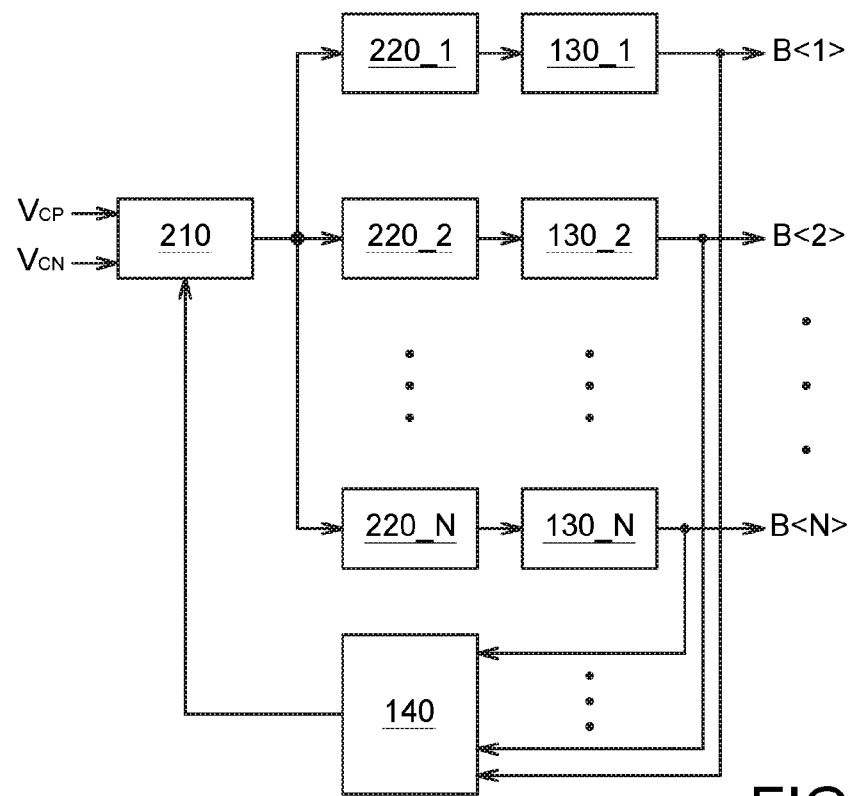
FIG. 17 illustrates a simplified block diagram of the SAR ADC according to an embodiment of the invention.

FIG. 17 illustrates a simplified block diagram of the SAR ADC according to an embodiment of the invention. In one embodiment, the SAR ADC 5 includes N latch circuits 220_1-220_N, each of which is coupled to one of the data drivers 130_1-130_N. For one full analog to digital conversion cycle, each latch circuit 220_1-220_N is used once to produce one bit of the conversion result. In other words, each latch circuit 220_1-220_N also acts in a time interleaved manner. A total of N parallel latch circuits are used in this embodiment, which is suitable for low resolution ADC applications (small N value). For higher resolution (larger N value) ADC applications, the embodiment shown in FIG. 13 that uses two latch circuits may be more suitable.

Figure 18:
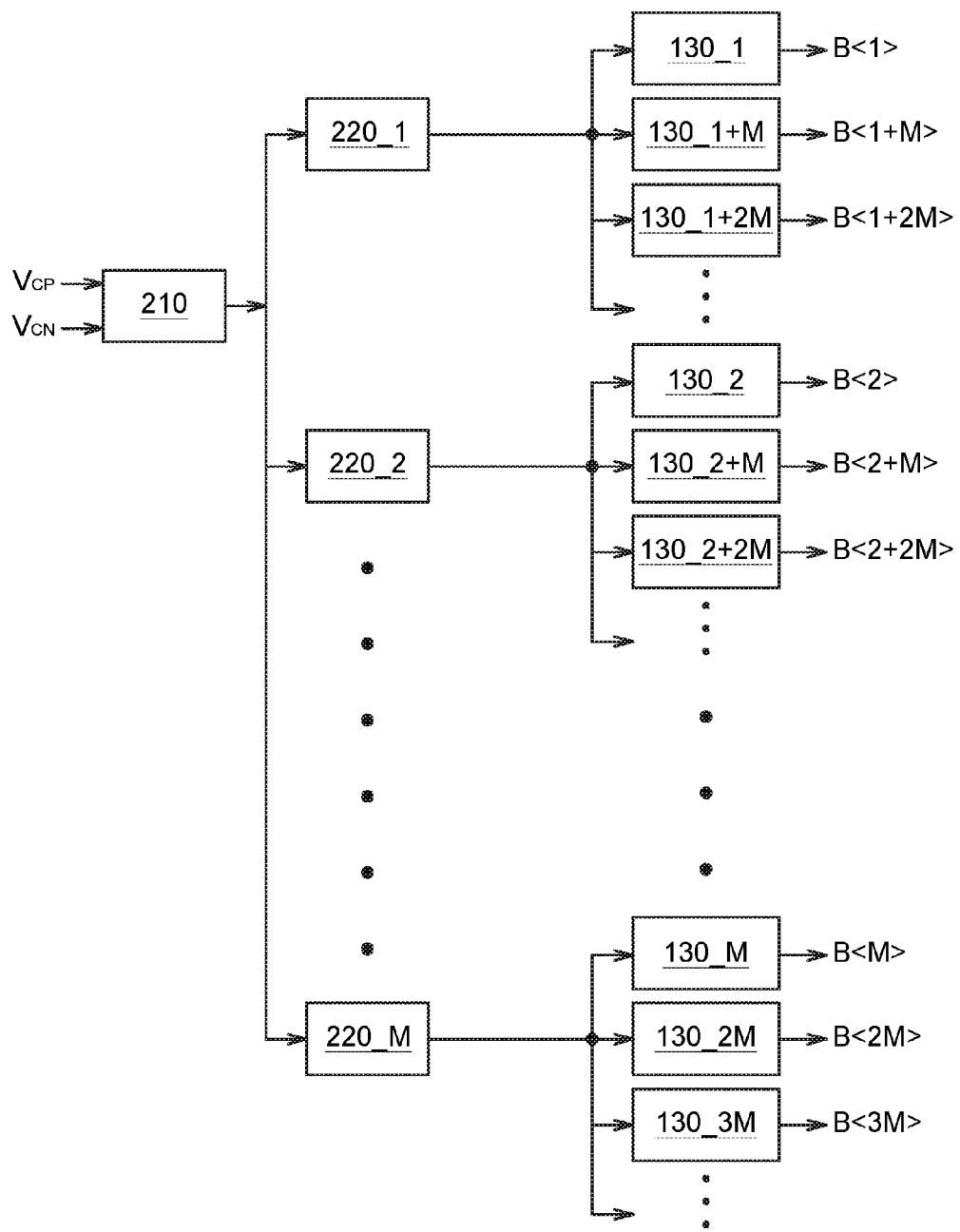
FIG. 18 illustrates a simplified block diagram of the SAR ADC according to an embodiment of the invention.

FIG. 18 illustrates a simplified block diagram of the SAR ADC according to an embodiment of the invention. The latch architecture shown in FIG. 18 is a hybrid architecture. A total of M parallel latch circuits are used in this embodiment, 3≤M≤N. That is, in addition to the first latch circuit 220_1 and the second latch circuit 220_2, the SAR ADC 5 further includes (M−2) latch circuits. Among the M latch circuits 220_1-220_M, the first latch circuit 220_1 is coupled to data drivers corresponding to bits (i×M+1) of the digital code, the second latch circuit 220_2 is coupled to data drivers corresponding to bits (i×M+2) of the digital code, where i is an integer greater than or equal to 0, and i×M is less than or equal to N. For example, when M is equal to 4, 4 latch circuits are used in the SAR ADC 5. The first latch circuit 220_1 is used for bits 1, 5, 9 . . . , the second latch circuit 220_2 is used for bits 2, 6, 10 . . . , the third latch circuit 220_3 is used for bits 3, 7, 11 . . . , and the fourth latch circuit 220_4 is used for bits 4, 8, 12 . . . . The output digital code is generated from bit 1, 2, 3 . . . to bit N in sequence.

In the embodiments shown in FIG. 12, FIG. 13, FIG. 17, and FIG. 18, each of the N data drivers 130_1-130_N may generate a bit ready signal to indicate a conversion state of a corresponding bit of the digital code. The self-ring logic 140 generates the enable signal $V_{EN}$ in response to the bit ready signal from each of the N data drivers 130_1-130_N. An example waveform of the bit ready signals and the enable signal $V_{EN}$ is shown in FIG. 12. Each bit ready signal has a rising edge successively, and the self-ring logic 140 generates the enable signal $V_{EN}$ in a pulse form accordingly to control the operation of the preamplifier circuit 210. The preamplifier circuit 210 is controlled in an asynchronous manner.

Figure 19:
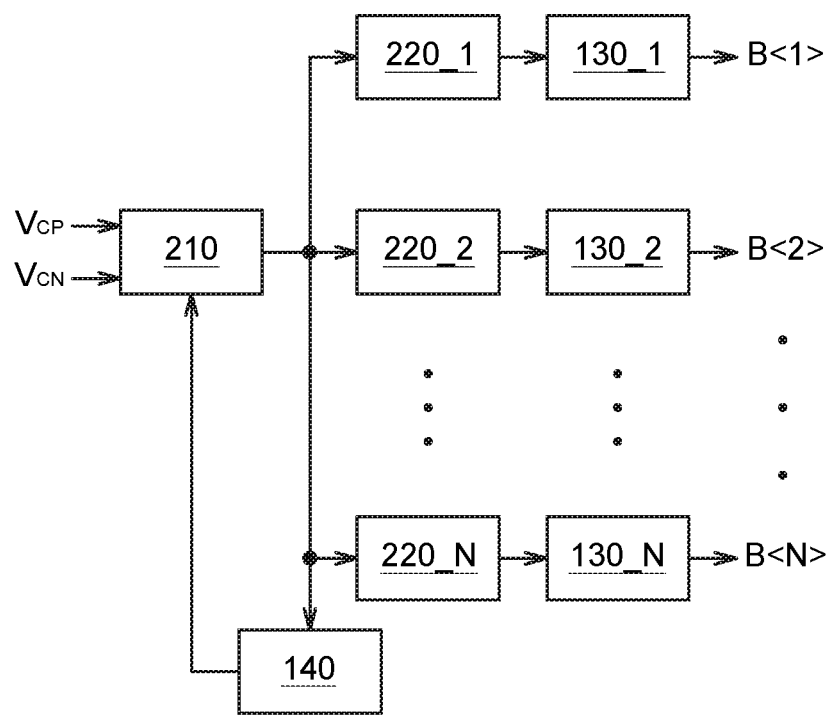
FIG. 19 illustrates a simplified block diagram of the SAR ADC according to an embodiment of the invention.

FIG. 19 illustrates a simplified block diagram of the SAR ADC according to an embodiment of the invention. In the SAR ADC 5 shown in FIG. 19, the self-ring logic 140 generates the enable signal $V_{EN}$ in response to the first amplifier output signal $V_{AP}$ and the second amplifier output signal $V_{AN}$. The data drivers 130_1-130_N do not need to produce a bit ready signal in this embodiment. The self-ring logic 140 determines when the conversion procedure completes according to the voltage levels of the first amplifier output signal $V_{AP}$ and the second amplifier output signal $V_{AN}$. For example, when the first amplifier output signal $V_{AP}$ and the second amplifier output signal $V_{AN}$ are equalized to either high or low, the self-ring logic 140 may inform the preamplifier circuit 210 to proceed to comparing the next bit.

Figure 20:
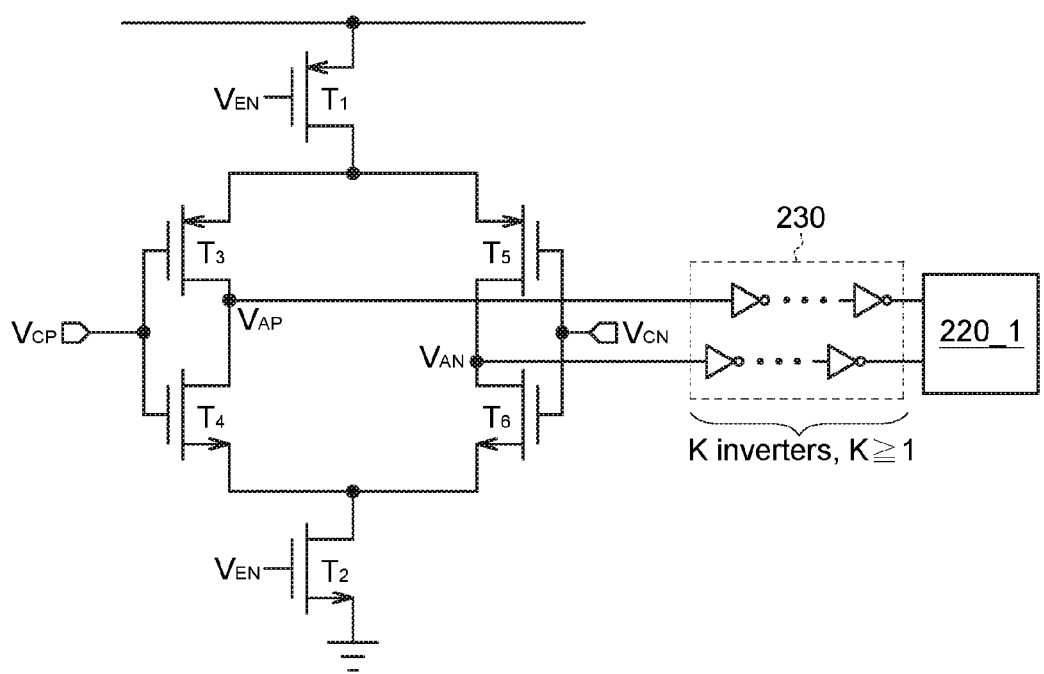
FIG. 20 illustrates a gain stage circuit that is inserted between the preamplifier circuit and the data drivers according to an embodiment of the invention.

FIG. 20 illustrates a gain stage circuit that is inserted between the preamplifier circuit and the data drivers according to an embodiment of the invention. In this embodiment, the SAR ADC 5 further includes a gain stage circuit 230 inserted between the preamplifier circuit 210 and the first latch circuit 220_1. The gain stage circuit 230 is configured to amplify the first amplifier output signal $V_{AP}$ and the second amplifier output signal $V_{AN}$. The gain stage circuit 230 may include one inverter or cascaded inverters. The voltage gain provided by the gain stage circuit 230 amplifies the first and second amplifier output signals $V_{AP}$ and $V_{AN}$ and hence speed up the operation of the preamplifier circuit 210. Another gain stage circuit similar to the gain stage circuit 230 may also be inserted between the preamplifier circuit 210 and the second latch circuit 220_2.

The proposed SAR ADC has a preamplifier circuit and a corresponding latch architecture that facilitate faster analog to digital conversion. Because the conversion is triggered on both the rising edge and the falling edge of a control signal (for example, an enable signal in an asynchronous SAR ADC, or a clock signal in a synchronous SAR ADC), the conversion throughput can be doubled. The power consumption is also reduced since a half number of the bit conversions do not consume energy. Moreover, the preamplifier circuit proposed herein can be applied to not only the SAR ADC but also other types of ADC that utilize a comparator.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A preamplifier circuit, for generating a first amplifier output signal and a second amplifier output signal in response to a first input signal, a second input signal, and an enable signal, the preamplifier circuit comprising:
   a first transistor, having a control terminal coupled to the enable signal, a first terminal coupled to a power supply line, and a second terminal;
   a second transistor, having a control terminal coupled to the enable signal, a first terminal coupled to a ground line, and a second terminal;
   a third transistor, having a control terminal coupled to the first input signal, a first terminal coupled to the second terminal of the first transistor, a second terminal coupled to the first amplifier output signal;
   a fourth transistor, having a control terminal coupled to the first input signal, a first terminal coupled to the second terminal of the second transistor, a second terminal coupled to the first amplifier output signal;
   a fifth transistor, having a control terminal coupled to the second input signal, a first terminal coupled to the second terminal of the first transistor, a second terminal coupled to the second amplifier output signal; and
   a sixth transistor, having a control terminal coupled to the second input signal, a first terminal coupled to the second terminal of the second transistor, a second terminal coupled to the second amplifier output signal;
   wherein the first, third, and fifth transistors are of a first conductivity type, and the second, fourth, and sixth transistors are of a second conductivity type.

2. The preamplifier circuit of claim 1, further comprises:
   a reset circuit, configured to equalize the first amplifier output signal and the second amplifier output signal.

3. The preamplifier circuit of claim 2, wherein the reset circuit comprises a switch coupled between the first amplifier output signal and the second amplifier output signal.

4. The preamplifier circuit of claim 2, wherein the reset circuit comprises:
   a first charge switch, coupled between the first amplifier output signal and the power supply line;
   a first discharge switch, coupled between the first amplifier output signal and the ground line;
   a second charge switch, coupled between the second amplifier output signal and the power supply line; and
   a second discharge switch, coupled between the second amplifier output signal and the ground line.

5. The preamplifier circuit of claim 4, wherein the first charge switch, the first discharge switch, the second charge switch, and the second discharge switch are controlled by the enable signal.

6. The preamplifier circuit of claim 2, wherein the reset circuit further comprises:
   a charge current source, coupled to the power supply line;
   a discharge current source, coupled to the ground line;
   a first charge switch, coupled between the first amplifier output signal and the charge current source;
   a first discharge switch, coupled between the first amplifier output signal and the discharge current source;
   a second charge switch, coupled between the second amplifier output signal and the charge current source; and
   a second discharge switch, coupled between the second amplifier output signal and the discharge current source.

7. The preamplifier circuit of claim 6, wherein the charge current source comprises a charge transistor having a control terminal coupled to the enable signal, and the discharge current source comprises a discharge transistor having a control terminal coupled to the enable signal.

8. The preamplifier circuit of claim 7, wherein the first charge switch, the first discharge switch, the second charge switch, and the second discharge switch are controlled by the enable signal, a constant voltage source or a controlled voltage source dependent on the first and second input signals.

9. The preamplifier circuit of claim 6, wherein a current of the charge current source is equal to a current of the discharge current source.

10. The preamplifier circuit of claim 2, further comprising:
    a first capacitor, coupled between the first terminal and the second terminal of the first transistor; and
    a second capacitor, coupled between the first terminal and the second terminal of the second transistor.

11. A successive approximation register (SAR) analog to digital converter (ADC), for generating a digital code with N bits in response to a differential input signal, N being a positive integer, the SAR ADC comprising:
    N data drivers, each of the N data drivers storing one bit of the digital code;
    a digital to analog converter (DAC), for sampling the differential input signal, wherein the DAC is driven by the N data drivers to generate a first input signal and a second input signal;
    a preamplifier circuit, for generating a first amplifier output signal and a second amplifier output signal in response to the first input signal, the second input signal, and an enable signal, the preamplifier circuit comprises:
       a first transistor, having a control terminal coupled to the enable signal, a first terminal coupled to a power supply line, and a second terminal;
       a second transistor, having a control terminal coupled to the enable signal, a first terminal coupled to a ground line, and a second terminal;
       a third transistor, having a control terminal coupled to the first input signal, a first terminal coupled to the second terminal of the first transistor, a second terminal coupled to the first amplifier output signal;
       a fourth transistor, having a control terminal coupled to the first input signal, a first terminal coupled to the second terminal of the second transistor, a second terminal coupled to the first amplifier output signal;
       a fifth transistor, having a control terminal coupled to the second input signal, a first terminal coupled to the second terminal of the first transistor, a second terminal coupled to the second amplifier output signal; and
       a sixth transistor, having a control terminal coupled to the second input signal, a first terminal coupled to the second terminal of the second transistor, a second terminal coupled to the second amplifier output signal;
       wherein the first, third, and fifth transistors are of a first conductivity type, and the second, fourth, and sixth transistors are of a second conductivity type;
    a first latch circuit, coupled between the preamplifier circuit and at least one of the data drivers;
    a second latch circuit, coupled between the preamplifier circuit and at least another one of the data drivers; and
    a self-ring logic circuit, configured to generate the enable signal;
    wherein the first latch circuit is different from the second latch circuit.

12. The SAR ADC of claim 11, wherein the first latch circuit is a rising-edge triggered latch, and the second latch circuit is a falling-edge triggered latch.

13. The SAR ADC of claim 11, wherein the first latch circuit is a NAND type latch, and the second latch circuit is a NOR type latch.

14. The SAR ADC of claim 11, wherein the first latch circuit is coupled to data drivers corresponding to bits 1, 3, 5, . . . , N−1 of the digital code, the second latch circuit is coupled to data drivers corresponding to bits 2, 4, 6, . . . , N of the digital code.

15. The SAR ADC of claim 11, wherein each of the N data drivers generates a bit ready signal to indicate a conversion state of a corresponding bit of the digital code, the self-ring logic generates the enable signal in response to the bit ready signal from each of the N data drivers.

16. The SAR ADC of claim 11, wherein the self-ring logic generates the enable signal in response to the first amplifier output signal and the second amplifier output signal.

17. The SAR ADC of claim 11, further comprising:
(M−2) latch circuits, coupled between the preamplifier circuit and the data drivers, M being an integer and 3≤M≤N;
wherein the first latch circuit is coupled to data drivers corresponding to bits (i×M+1) of the digital code, the second latch circuit is coupled to data drivers corresponding to bits (i×M+2) of the digital code, where i is an integer greater than or equal to 0, and i×M is less than or equal to N.

18. The SAR ADC of claim 11, further comprising:
a gain stage circuit, inserted between the preamplifier circuit and the first latch circuit, configured to amplify the first and second amplifier output signals, the gain stage circuit comprising one inverter or cascaded inverters.

19. The SAR ADC of claim 11, further comprises:
a reset circuit, configured to equalize the first amplifier output signal and the second amplifier output signal.

20. The preamplifier circuit of claim 19, wherein the reset circuit comprises a switch coupled between the first amplifier output signal and the second amplifier output signal.

21. The SAR ADC of claim 19, wherein the reset circuit comprises:
a first charge switch, coupled between the first amplifier output signal and the power supply line;
a first discharge switch, coupled between the first amplifier output signal and the ground line;
a second charge switch, coupled between the second amplifier output signal and the power supply line; and
a second discharge switch, coupled between the second amplifier output signal and the ground line.

22. The SAR ADC of claim 21, wherein the first charge switch, the first discharge switch, the second charge switch, and the second discharge switch are controlled by the enable signal.

23. The SAR ADC of claim 19, wherein the reset circuit further comprises:
a charge current source, coupled to the power supply line;
a discharge current source, coupled to the ground line;
a first charge switch, coupled between the first amplifier output signal and the charge current source;
a first discharge switch, coupled between the first amplifier output signal and the discharge current source;
a second charge switch, coupled between the second amplifier output signal and the charge current source; and
a second discharge switch, coupled between the second amplifier output signal and the discharge current source.

24. The SAR ADC of claim 23, wherein the charge current source comprises a charge transistor having a control terminal coupled to the enable signal, and the discharge current source comprises a discharge transistor having a control terminal coupled to the enable signal.

25. The SAR ADC of claim 24, wherein the first charge switch, the first discharge switch, the second charge switch, and the second discharge switch are controlled by the enable signal, a constant voltage source or a controlled voltage source dependent on the first and second input signals.

26. The SAR ADC of claim 23, wherein a current of the charge current source is equal to a current of the discharge current source.

27. The SAR ADC of claim 19, further comprising:
a first capacitor, coupled between the first terminal and the second terminal of the first transistor; and
a second capacitor, coupled between the first terminal and the second terminal of the second transistor.

* * * * *